United States Patent [19]

Cogan

[11] Patent Number: 4,811,065
[45] Date of Patent: Mar. 7, 1989

[54] POWER DMOS TRANSISTOR WITH HIGH SPEED BODY DIODE

[75] Inventor: Adrian I. Cogan, San Jose, Calif.

[73] Assignee: Siliconix incorporated, Santa Clara, Calif.

[21] Appl. No.: 61,352

[22] Filed: Jun. 11, 1987

[51] Int. Cl.[4] .............................................. H01L 29/78
[52] U.S. Cl. ..................................... 357/23.4; 357/86; 357/15; 357/52; 357/59; 357/46
[58] Field of Search ........................ 357/23.4, 15, 59 I, 357/46, 52, 52 D, 86

[56] References Cited

U.S. PATENT DOCUMENTS 4,300,150 10/1981 Colak ...................................... 357/23
4,344,081 8/1982 Pao et al. ......................... 357/23.4 X
4,689,647 8/1987 Nakagawa et al. ................ 357/15 X

FOREIGN PATENT DOCUMENTS 2137412A 10/1984 United Kingdom ............. 357/15 X

OTHER PUBLICATIONS

Rein et al, "Schnelle Integrierte Digital Schaltungen mit Schottky-Dioden," Wiss Br, *AEG-Telefunken*, 45 (1972) 3, pp. 129-141.
Rudy Severns, "dV$_{DS}$/dt Turn-On in MOSFETS", Apr. 1984, *Siliconix Technical Article* TA84-4, pp. 1-8.
Peter Carlson, "Power MOSFET Ruggedness Testing and Performance" Oct. 1986, *PCIM*, pp. 85-88, 91-92.

*Primary Examiner*—Andrew J. James
*Assistant Examiner*—William A. Mintel
*Attorney, Agent, or Firm*—Alan H. MacPherson; Brian D. Ogonowsky; Paul J. Winters

[57] ABSTRACT

This inventive DMOS transistor provides faster turn-on switching than prior art lateral and vertical DMOS transistors in dV/dt situations and prevents catastrophic failures from high dV/dt's. The preferred embodiment of this improved device combines a Schottky diode with a vertical DMOS transistor, within the semiconductor structure itself, to form a device equivalent to a Schottky diode in parallel with an N channel vertical DMOS transistor. The Schottky diode effectively replaces the body diode of the transistor when forward biasing voltages are applied to the DMOS transistor. Thus, the body diode is never forward biased and there is no recovery time associated with the body diode. This speeds up the turn-on of the DMOS transistor since there are no minority carriers in the P-N junction body diode to recombine. Also, the parasitic bipolar junction transistor (BJT), formed by the source, body region, and drain, cannot turn on, thus preventing second breakdown of the BJT.

6 Claims, 2 Drawing Sheets

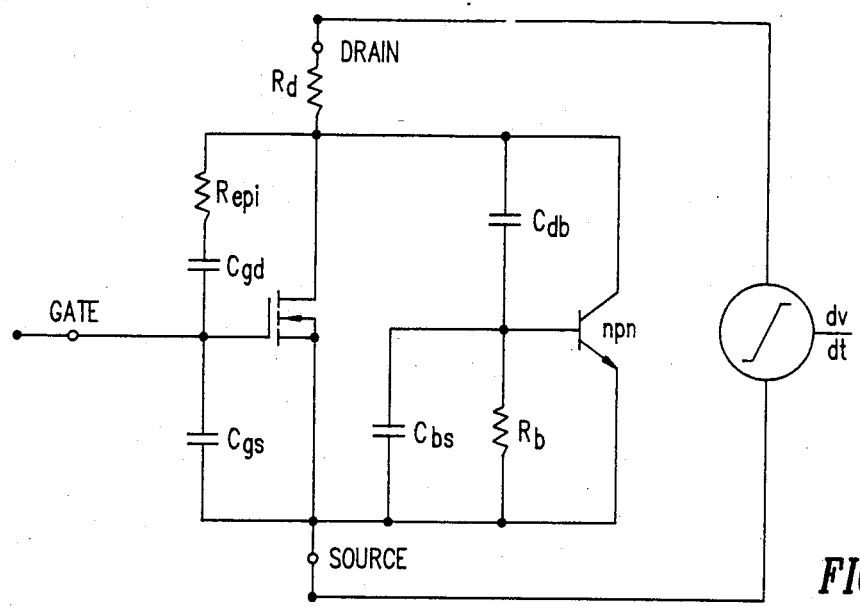
FIG. 4 (Prior Art)
N CHANNEL MOSFET EQUIVALENT CIRCUIT
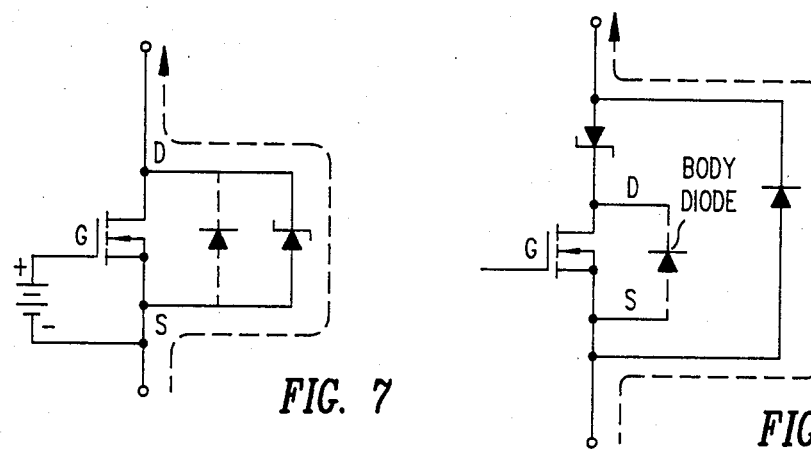
FIG. 7
FIG. 5
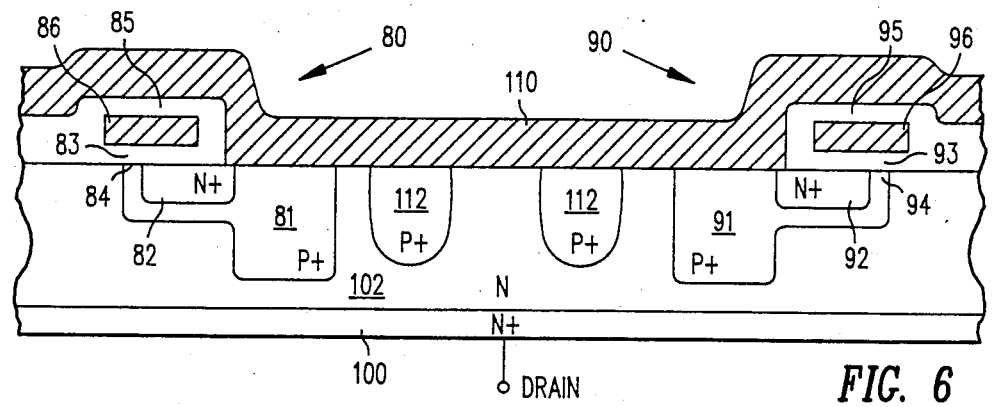
FIG. 6

POWER DMOS TRANSISTOR WITH HIGH SPEED BODY DIODE

BACKGROUND

1. Field of the Invention

This invention relates to double diffused MOS (DMOS) transistors and more particularly to an improved power DMOS transistor.

2. Description of Prior Art

A DMOS transistor is one in which the difference in the diffusion boundaries of sequentially introduced impurities is used to define channel length. FIG. 1 is a cross-sectional diagram of a lateral DMOS transistor constructed in accordance with the prior art. Transistor 10 of FIG. 1 includes N+ type drain region 12d diffused into N type substrate 14, P+ body region 16, and N+ type source region 12s located within P+type body region 16. Located above a portion of P+ type body region 16 is a layer of gate insulation 18, and above gate insulation 18 is polycrystalline silicon gate 12g. Field oxide layer 19 provides insulation and a protective layer for the device. Illustrated in FIG. 1 are metal contacts 22, 24. Metal contact 24 makes electrical connection to source region 12s and body region 16 while metal contact 22 makes electrical connection to drain 12d. A third metal contact (not shown) makes electrical contact to polycrystalline silicon gate 12g. As is well-known in the art, when a voltage above the threshold voltage of transistor 10 is applied to gate 12g, an N type channel is created in P+ type body region 16 under gate 12g, and current can flow between source 12s and drain 12d. Source 12s, body region 16, and drain 12d correspond respectively to the emitter, base, and collector of a parasitic bipolar transistor. Accordingly, in an attempt to prevent turn-on of the parasitic bipolar transistor during operation of the DMOS transistor 10, source 12s and body region 16 are normally shorted together by means of an ohmic connection, such as metal contact 24. DMOS transistors such as that shown in FIG. 1 are especially useful in conducting higher currents due to the short channel length. U.S. Pat. No. 4,300,150 to Colak further describes this lateral DMOS transistor and is incorporated by reference.

A prior art variation of the transistor of FIG. 1 is illustrated in FIG. 2. FIG. 2 shows transistors 48, 50, which include N+type substrate 52 serving as a drain, located below a more lightly doped N type epitaxial layer 54. Within N type layer 54 is P+ type deep body region 56 and P type region 57. Within body region 57 are N+ source regions 58, 60. Between the diffusion boundaries of source regions 58, 60 and body region 57 are channel regions 61, 63, and overlying channel regions 61, 63, is gate insulation 62, 64. Above gate insulation 62, 64 are polycrystalline silicon gates 66, 68. When voltage applied to gates 66, 68 is above the threshold voltage of transistors 48, 50, current can flow between drain 52 and source regions 58, 60. Metal contact, 70 makes ohmic contact to source regions 58, 60 and deep body region 56, and a gate contact (not shown) makes ohmic contact to gates 66, 68. These transistors are known as vertical DMOS transistors.

As is well-known in the art, when a positive voltage above the threshold voltage of transistors 48, 50 is applied to gates 66, 68 of transistors 48, 50, a thin N type conductive channel is created in channel regions 61, 63 just below gates 66, 68. The more positive the gate voltage, the thicker this conductive channel becomes and the more working current flows. Current flows horizontally near the surface between source regions 58, 60 and epitaxial layer 54, and then vertically through epitaxial layer 54 and drain 52.

A typical use of a vertical DMOS transistor is as a switching device or speed control for a motor, or as a switching device in power conversion equipment. When a DMOS transistor, used with an inductive load, is rapidly turned off, the large dV/dt due to the rapid turn-off of the DMOS transistor causes an oscillation or transient to be generated in the circuit due to the LC circuit created by the combination of the inductive load with the capacitances throughout the circuit and parasitic capacitances in the DMOS transistor itself. This transient voltage can cause turn-on of the DMOS transistor if the voltage between the source and the drain forward biases the body diode within the DMOS transistor. The body diode is formed by the P-N junction between P+ type deep body region 56, or P type body region 57, and N type layer 54, shown in FIG. 2. (This forward bias voltage can be generated in a number of ways depending on the usage of the transistor.) The now supposedly "off" DMOS transistor is conducting until the voltage reverses and the body diode is no longer forward biased. Further, if the voltage swing is fast enough, it can turn on the parasitic bipolar junction transistor (BJT) formed by the N+ type source, the P+ type body, and the N type epitaxial layer. If sufficient current is drawn through the BJT, avalanche breakdown or second breakdown of the BJT may occur, potentially resulting in catastrophic failure of the DMOS transistor. FIG. 3 shows a simplified equivalent circuit within the structure of a power DMOS transistor showing the various capacitances in the transistor and the parasitic BJT. The body diode in FIG. 3 is the base-collector junction of the parasitic BJT. Also shown in FIG. 3 is gate-drain capacitance $C_{gd}$, gate-source capacitance $C_{gs}$, drain-body capacitance $C_{db}$, body-source capacitance $C_{bs}$, body-resistance $R_b$, body-todrain resistance $R_d$, and epitaxial resistance $R_{epi}$. FIG. 4 shows an equivalent circuit to that shown in FIG. 3.

When the body diode is forward biased, minority carriers are injected into the P and N junctions of the body diode, thus increasing the recovery time of the body diode when it changes abruptly from the forward bias state to the reverse bias state. This causes the DMOS transistor to conduct current for an even longer time after it has been supposedly shut off. Some prior art DMOS transistors have modified the P-N body diode such that the minority carriers have a lower lifetime, thus decreasing recombination time, however, this modification increases the resistance of the P type and N type material and complicates the processing sequence This dV/dt turn-on may be avoided in many ways. One way is to introduce an external silicon diode in parallel with the DMOS transistor, and a low voltage Schottky diode in series with the DMOS transistor, so that only the diode in parallel will conduct current, thus diverting current from flowing through the body diode. This circuit is shown in FIG. 5. Using this circuit, however, incurs a penalty in the power cost of the series diode and the extra cost of both external diodes. All methods known to the Applicant which bypass current around the body diode use external components.

Siliconix Technical article TA84-4, entitled "$dV_{ds}/dt$ Turn-On in MOSFETs", by Rudy Severns, dated April 1984, discusses modes of dV/dt turn-on in detail and is incorporated by reference. The article "Power MOSFET Ruggedness Testing and Performance" by Peter J. Carlson in PCIM, October 1986, provides more details on dV/dt turn-on and is also incorporated by reference.

SUMMARY

The device hereinafter described provides faster turn-on switching than prior art lateral and vertical DMOS transistors in dV/dt situations and prevents catastrophic failures from high dV/dt's. The preferred embodiment of this improved device combines a Schottky diode with a vertical DMOS transistor, within the semiconductor structure itself, to form a device equivalent to a Schottky diode in parallel with an N channel vertical DMOS transistor. The Schottky diode effectively replaces the body diode of the transistor when forward biasing voltages are applied to the DMOS transistor. Thus, dV/dt turn-on of the body diode is prevented at little cost.

In the preferred embodiment, the Schottky diode metal anode is overlying and in contact with an N type epitaxial layer formed on an N+ type substrate, thus creating a Schottky diode from the junction of the metal with the N type layer. The N+ type substrate acts as a the drain for the vertical DMOS transistor. The metal anode is also in ohmic contact with a P type body region and an N+ type source region, formed in the P type body region, thus effectively shorting the source region to the body region. A polycrystalline silicon control gate overlies a gate oxide layer above a channel region, the channel region being the area of the P type region just under the gate oxide layer which inverts and conducts when a sufficient positive voltage is applied to the control gate. The purpose of the Schottky diode is to divert current from flowing through the body diode of the transistor during high dV/dt situations. Thus, the body diode is never forward biased and there is no recovery time associated with the body diode. This speeds up the turn-on of the DMOS transistor since there are no minority carriers in the PN body diode to recombine. Also, the parasitic bipolar junction transistor, formed by the source, body region, and drain, cannot turn on, thus preventing second breakdown of the BJT.

BRIEF DESCRIPTION OF THE DRAWINGS

FIG. 4 is a schematic diagram of the circuit shown in FIG. 3.

FIG. 5 shows a prior art DMOS transistor with a bypass diode in parallel.

FIG. 6 is a cross-section of a DMOS transistor in accordance with the preferred embodiment of the invention.

FIG. 7 is an equivalent circuit of the present invention.

DETAILED DESCRIPTION

Figure 1:
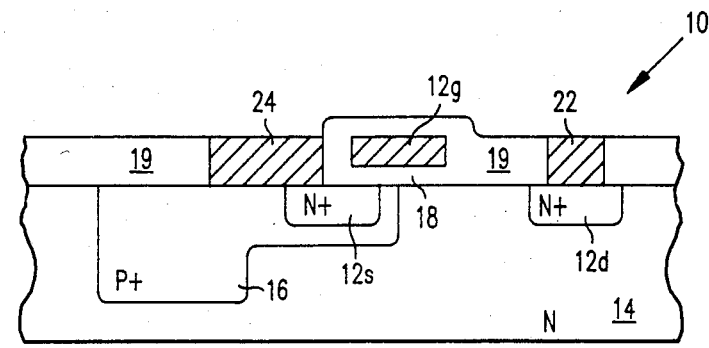
FIG. 1 shows a cross-section of a prior art lateral DMOS transistor.
Figure 2:
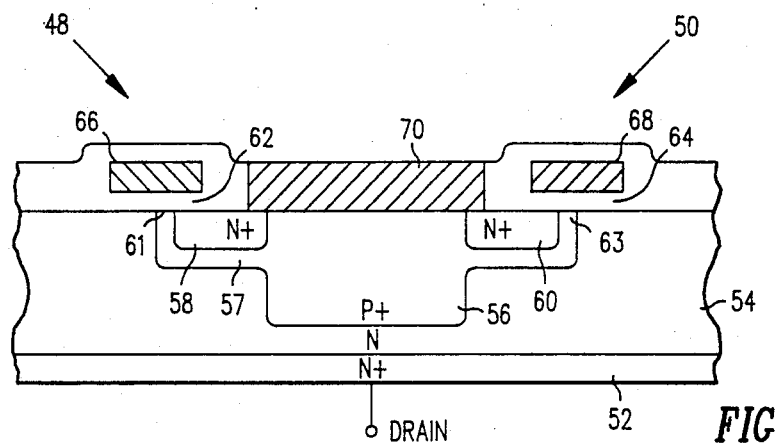
FIG. 2 shows a cross-section of a prior art vertical DMOS transistor.
Figure 3:
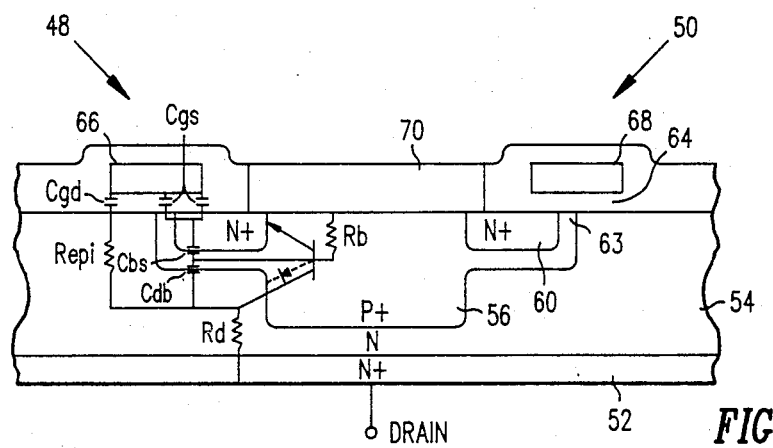
FIG. 3 shows an equivalent circuit of a DMOS transistor drawn within the structure of a prior art DMOS transistor.

Shown in FIG. 6 are identical DMOS transistors 80, 90 formed on N+ type substrate 100. Substrate 100 also acts as a drain for transistors 80, 90. Grown on substrate 100 is N type epitaxial layer 102. Formed in N type epitaxial layer 102 are deep body regions 81, 91 for transistors 80, 90 respectively. Within P+ type body regions 81, 91 are formed N+ type source regions 82, 92. Gate oxide 83, 93 is formed above channel regions 84, 94 within P+ type body regions 81, 91. Above gate oxide 83, 93 are control gates 86, 96 to control transistors 80, 90 respectively. Schottky diode metal anode 110 overlies the surface of N Type epitaxial layer 102 and is in ohmic contact with N+ type source regions 82, 92 and P+ type body regions 81, 91, since ohmic contact is inherently made between a Schottky metal and an N+ or P+ type semiconductor. Schottky metal anode 110, however, is in rectifying contact with N type epitaxial layer 102 due to the lighter N type doping of epitaxial layer 102. Metal anode 110 is insulated from gates 86, 96 a field oxide 85, 95. Multiple P+ type regions 112 form a P-N junction guard ring to increase the reverse breakdown voltage of the Schottky diode created by the junction of anode 110 and N type epitaxial layer 102.

The resulting structure is equivalent to a Schottky diode in parallel with a DMOS transistor as illustrated in FIG. 7.

The operation of DMOS transistor 90 follows. Source 92 and metal anode 110 are typically grounded, and since metal anode 110 is in ohmic contact with P+ type body region 91, P+ type body region 91 is also grounded. When a positive control voltage above the threshold voltage of DMOS transistor 90 is applied to control gate 96, an N type channel is created in channel region 94 and source 92 is effectively shorted to drain 100.

If the load which transistor 90 is switching is inductive, the sharp dV/dt developed when transistor 90 is suddenly shut off causes oscillations or transients to occur in the circuit, and a high negative voltage may appear on drain 100. This negative voltage may appear by other means depending on the usage of the DMOS transistor. If the Schottky diode was not present, this negative voltage would forward bias the P-N body diode. The fast Schottky diode in parallel with DMOS transistor 90, however, prevents the body diode from turning on since 0.3 volts is dropped across the Schottky diode and the body diode requires approximately 0.7 volts across it to turn on.

The fact that the Schottky diode bypasses all current from the body diode enables DMOS transistor 90 to more rapidly turn on when the body and Schottky diodes are once again reverse biased and a voltage is applied to control gate 96. This is because, since the body diode was not forward biased, no minority carriers exist in P type body region 91 and N type layer 102 and, therefore, no recovery time or recombination is required in the body diode when it is subsequently reversed biased Multiple P type regions 112, placed at correct distances from each other, will increase the Schottky diode breakdown voltage above the value achieved by a Schottky diode without the multiple P regions, due to the deeper depletion region formed within N epitaxial layer 102. Thus, the preferred embodiment offers two advantages over the prior art: faster transistor turn-on time and higher transistor breakdown voltages.

As previously stated, prior art devices do not form a Schottky diode integral with the DMOS transistor as hereinabove described. The advantages of this integral Schottky diode in parallel with the DMOS transistor are achieved at very low cost and with no additional processing steps.

This invention is manufactured using well-known techniques, and its method of manufacture will be obvious to those skilled in the art.

This invention is by no means limited to the description of the preferred embodiment. While the invention has been particularly shown and described with reference to the preferred embodiment thereof, it will be understood by those skilled in the art that various changes in form and detail may be made therein without departing from the spirit and scope of the invention. For example, using a P channel DMOS transistor instead of the described N channel DMOS transistor will also provide the advantages mentioned above.

I claim:

1. An improved double diffused MOS (DMOS) transistor of the type including a semiconductor substrate having a top surface, a body region formed in said top surface of said substrate, a source region formed in said body region, a drain region formed in said substrate outside of said body region, a gate insulation layer formed over said top surface of said substrate between said source region and said drain region, and a control gate formed over said gate insulation layer, wherein the improvement comprises:

a monolithic Schottky diode including a metal anode in rectifying contact with said semiconductor substrate and in ohmic contact with said source region and body region of said DMOS transistor, said drain region acting as a cathode for said Schottky diode so that said Schottky diode is in parallel with said source region and said drain region of said DMOS transistor.

2. An improvement to a DMOS transistor as in claim 1 further comprising regions of a conductivity type opposite that of said substrate formed in said substrate and in contact with said metal anode of said Schottky diode in order to increase the breakdown voltage of said Schottky diode.

3. A semiconductor device comprising:

a substrate of a first conductivity type, having a bottom and top surface, a region of said bottom surface acting as a drain of a DMOS transistor;

a first region of a second conductivity type opposite to said first conductivity type formed in and on said top surface of said substrate, said first region acting as a body region of said transistor;

a second region of said first conductivity type formed within said first region, said second region acting as a source of said transistor;

a channel region within said first region;

a control gate formed over and insulated from said channel region; and a metal anode formed over and in ohmic contact with said first and second regions, excluding said channel region, and in rectifying contact with said top surface of said substrate, forming a Schottky diode with said substrate.

4. A semiconductor device as in claim 3 further comprising regions of said second conductivity type formed in and on said top surface of said substrate and in contact with said metal anode in order to increase the breakdown voltage of said Schottky diode.

5. A semiconductor device comprising:

a substrate of a first conductivity type, having a bottom and top surface;

a first region of a second conductivity type opposite to said first conductivity type formed in and on said top surface of said substrate, said first region acting as a body region of a DMOS transistor;

a second region of said first conductivity type formed within said first region, said second region action as a source of said transistor;

a third region of said first conductivity type formed in and on said top surface of said substrate, said third region acting as a drain of said transistor;

a channel region within said first region;

a control gate formed over and insulated from said channel region; and a metal anode formed over and in ohmic contact with said first and second regions, excluding said channel region, and in rectifying contact with said top surface of said substrate, forming a Schottky diode with said substrate.

6. A semiconductor device as in claim 5 further comprising regions of said second conductivity type formed in and on said top surface of said substrate and in contact with said metal anode in order to increase the breakdown voltage of said Schottky diode.

* * * * *